United States Patent
Lin et al.

(10) Patent No.: US 7,499,517 B2
(45) Date of Patent: Mar. 3, 2009

(54) SHIFT REGISTER AND SHIFT REGISTER SET USING THE SAME

(75) Inventors: Shih-Chin Lin, Mailiao Township, Yunlin County (TW); Hsiao-Yi Lin, Hsinchu (TW)

(73) Assignee: TPO Displays Corp., Chu-Nan (TW)

( * ) Notice: Subject to any disclaimer, the term of this patent is extended or adjusted under 35 U.S.C. 154(b) by 822 days.

(21) Appl. No.: 11/035,784

(22) Filed: Jan. 13, 2005

(65) Prior Publication Data
US 2005/0289422 A1 Dec. 29, 2005

(30) Foreign Application Priority Data
Jun. 24, 2004 (TW) ............... 93118247 A

(51) Int. Cl.
*G11C 19/00* (2006.01)

(52) U.S. Cl. .......................... 377/64; 377/67

(58) Field of Classification Search ........................ None
See application file for complete search history.

(56) References Cited

U.S. PATENT DOCUMENTS

| 6,108,394 A | * | 8/2000 | Dilbeck ....................... 377/67 |
| 6,339,631 B1 | * | 1/2002 | Yeo et al. .................... 377/64 |
| 6,542,569 B2 | * | 4/2003 | Manning .................... 377/64 |
| 6,909,417 B2 | * | 6/2005 | Washio et al. ............... 345/98 |
| 7,145,545 B2 | * | 12/2006 | Zebedee et al. ............ 345/100 |
| 2005/0036581 A1 | * | 2/2005 | Lin ............................. 377/54 |

\* cited by examiner

*Primary Examiner*—Cassandra Cox
(74) *Attorney, Agent, or Firm*—Liu & Liu

(57) ABSTRACT

A shift register and a shift register are provided. The shift register comprises the switch circuit, the latch circuit, and the inverter circuit 170. The shift register set, by alternately-serially connecting two types of shift registers, can receive two clock signals and an initial pulse signal to control the output waveform. The output of the present stage shift register can be used to control the turn-on time of the nest stage shift register. Further, by changing the circuit driving signal from the dynamic signal to the static signal, the circuit can operate only when the signal is "0" or "1" without being affected by the signal rising time and the falling time so that the circuit can operate in a more stable status.

19 Claims, 10 Drawing Sheets

SHIFT REGISTER AND SHIFT REGISTER SET USING THE SAME

CROSS-REFERENCE TO RELATED APPLICATION

This application claims the priority benefit of Taiwan application serial no. 93118247, filed on Jun. 24, 2004.

BACKGROUND OF THE INVENTION

1. Field of the Invention

This invention generally relates to a shift register, and more particularly to a shift register and a shift register set by changing the circuit driving signal from the dynamic signal to the static signal so that the circuit can operate only when the signal is "0" or "1".

2. Description of Related Art

For current PMOS shift registers, the driving signal is dynamic so that the circuit may operate even when the signal is not "0" or "1". Further, during the rising time and falling time of the driving signal, the circuit will be affected and circuit cannot operate accurately. In addition, because driving signal is dynamic, for the existing device manufacturing technology, there is an existing risk.

FIG. 7 is the block diagram of a conventional shift register set. In FIG. 7, the shift register set 700 includes shift registers 702, 712, 722 and 732. Each shift register includes a first input terminal 704, 714, 724 or 734, and a second input terminal 706, 716, 726 or 736. The shift registers 702, 712, 722 and 732 are similar in structure, and are connected in series. In the prior art, each of the shift register 702, 712, 722 and 732 is made of CMOS comprising a NMOS transistor and a PMOS transistor. Because it uses CMOS, four input signals are required, with two input signals for a set of alternate shift registers 702 and 722, another two input signals for another set of alternate shift registers 712 and 732.

FIG. 8 is the circuit diagram of the conventional shift register. The existing shift registers 702, 712, 722 and 732 can each have a structure similar to the shift register 800 (e.g., shift register sold by SONY) shown in FIG. 8. The shift register 800 includes a CMOS (transistors P1 and N1), a NOR gate X1, a reset transistor P2, and inverters X2, X3, X4, X5, X6 and X7. In FIG. 8, the shift register 800 receives a first input signal, a second input signal, and a clock signal, and will determine whether or not to turn on the transistors P1 and N1 based on the first input signal and the second input signal. The shift register 800 then outputs an output signal from inverter X5 after the signal passes through the inverters X7, X3 and X6.

In light of the above, the driving signal of the traditional shift register is dynamic and thus the circuit may operate when the driving signal is transient between "0" and "1". Further, during the rising time and falling time of the driving signal, the circuit will be affected and thus the shift register cannot operate accurately.

SUMMARY OF THE INVENTION

The present invention is directed to a shift register by changing the circuit driving signal from the dynamic signal to the static signal so that the circuit can operate only when the signal is "0" or "1".

The present invention provides a display system, the display system comprises a timing controller for outputting a plurality of scan signals with different timing, an initial pulse signal, a first clock signal and a second clock signal; a gate driving circuit electrically coupled to the timing controller for outputting a driving signal according to the scan signals; a gamma correction circuit for outputting a gamma correction voltage; a data driving circuit electrically coupled to the timing controller and the gamma correction circuit for receiving the initial pulse signal, the first clock signal and the second clock signal, the data driving circuit including a shift register set, which includes a first shift register and a second shift register being alternately-serially connected; and a panel display unit driven by the data driving circuit and the gate driving circuit.

In one embodiment of the present invention, the first shift register and the second shift register outputting the first clock signal and the second clock signal when receiving signals having the same phase.

In one embodiment of the present invention, the first clock signal and the initial pulse signal have the same phase, and the first clock signal and the second clock signal have the opposite phases.

In an embodiment of the present invention, when there are a plurality of odd stage shift registers and even stage shift registers, the plurality of odd stage shift registers and the plurality of even stage shift registers are alternately arranged.

The present invention provides an electronic device for receiving a first clock signal, a second clock signal and an initial pulse signal, which is characterized in that the electronic device at least includes a first shift register and a second shift register being alternately-serially connected, wherein the first shift register and the second shift register outputting the first clock signal and the second clock signal when receiving signals having the same phase with the initial pulse signal.

In an embodiment of the present invention, the first clock signal and the initial pulse signal having the same phase and the first clock signal and the second clock signal having the opposite phases.

Because the present invention uses two cross-connected shift registers, it can use two clock signals and an initial pulse signal to control the output waveform. In addition, the output of the present stage can be used to control the time to turn on the shift register in the next stage. Further, by changing the driving signal from the dynamic to the static signal, the circuit can operate only when the signal is "0" or "1" without being affected by the rising time or the falling time of the signal so that the circuit can operate in a more stable status.

The present invention further provides a shift register set, comprising at least a first shift register and a second shift register operatively coupled in series, each shift register having a first input terminal and a second input terminal, an output terminal, and an initial pulse signal terminal; and a first clock signal and a second clock signal, each coupled to one of the first input terminal and the second input terminal for each of the first and second shift registers.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

The present invention provides a different shift register set. Although the description made below relates to a display system, the shift register set is not limited for use in a display system. The shift register set could be used in any electronic device that requires shift registers.

Figure 1A:
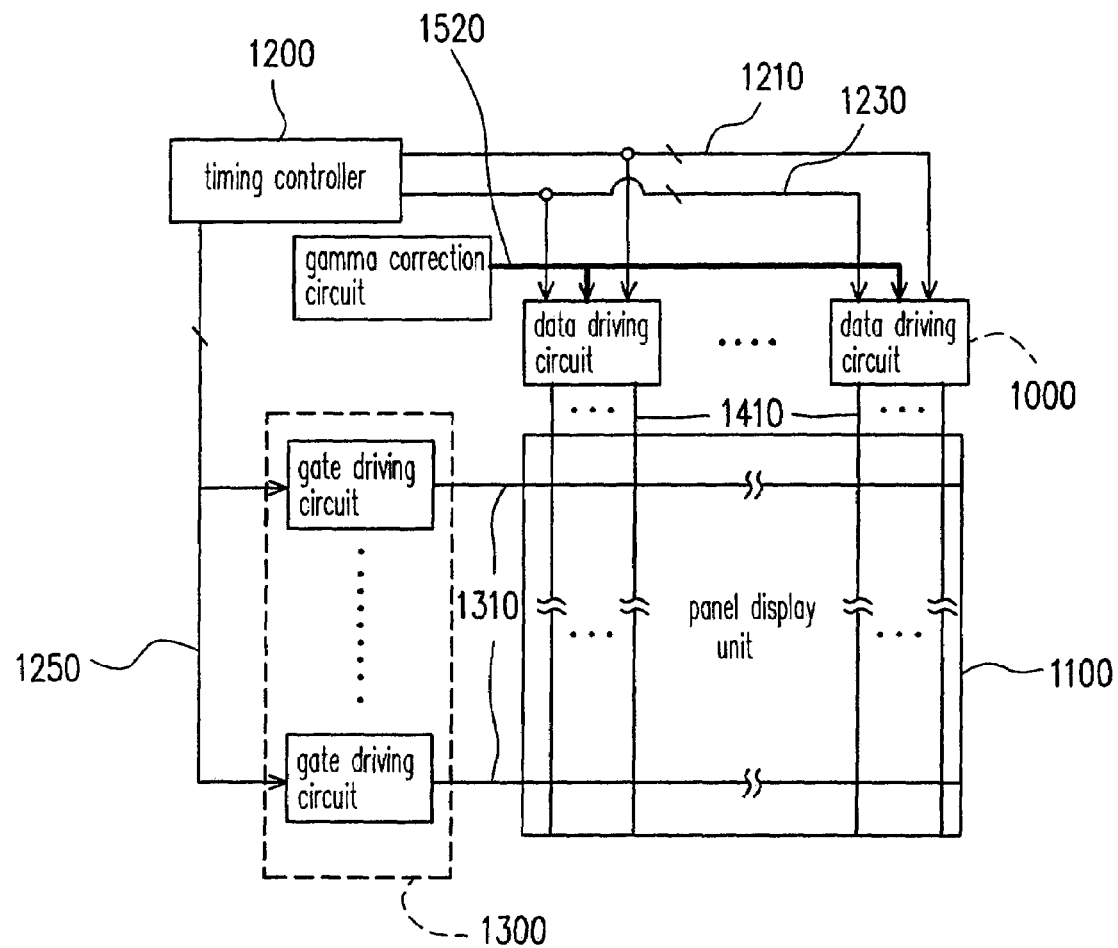
FIG. 1A is a block diagram of a display system in accordance with an embodiment of the present invention.

FIG. 1A is a block diagram of a display system in accordance with an embodiment of the present invention. In the embodiment, panel display unit 1100 has a plurality of gate lines 1310 and data lines 1410 intersecting each other to define an array of nodes for pixels. A pixel is presented at the cross point or node at each intersection of the gate lines 1310 and data lines 1410. The pixel determines its display status according to a gate signal in an active period. As could be easily known by those skilled in the art, the panel display unit 1100 may be a liquid crystal display unit or an organic light-emitting device.

The timing controller 1200 provides a plurality of scan signals 1250 with different timing to the gate driving circuits 1300. Each gate driving circuit 1300 receives a corresponding scan signal 1250 and produces driving signal to a corresponding gate line 1310. The timing controller 1200 further provides an initial pulse signal, a first clock signal, a second clock signal and a horizontal synchronization signal 1230. The data driving circuit 1000 receives the initial pulse signal, the first and second clock signals, the horizontal synchronization signal 1230 and gamma correction voltage 1520 to produce driving signals for a corresponding data line 1410.

Figure 1B:
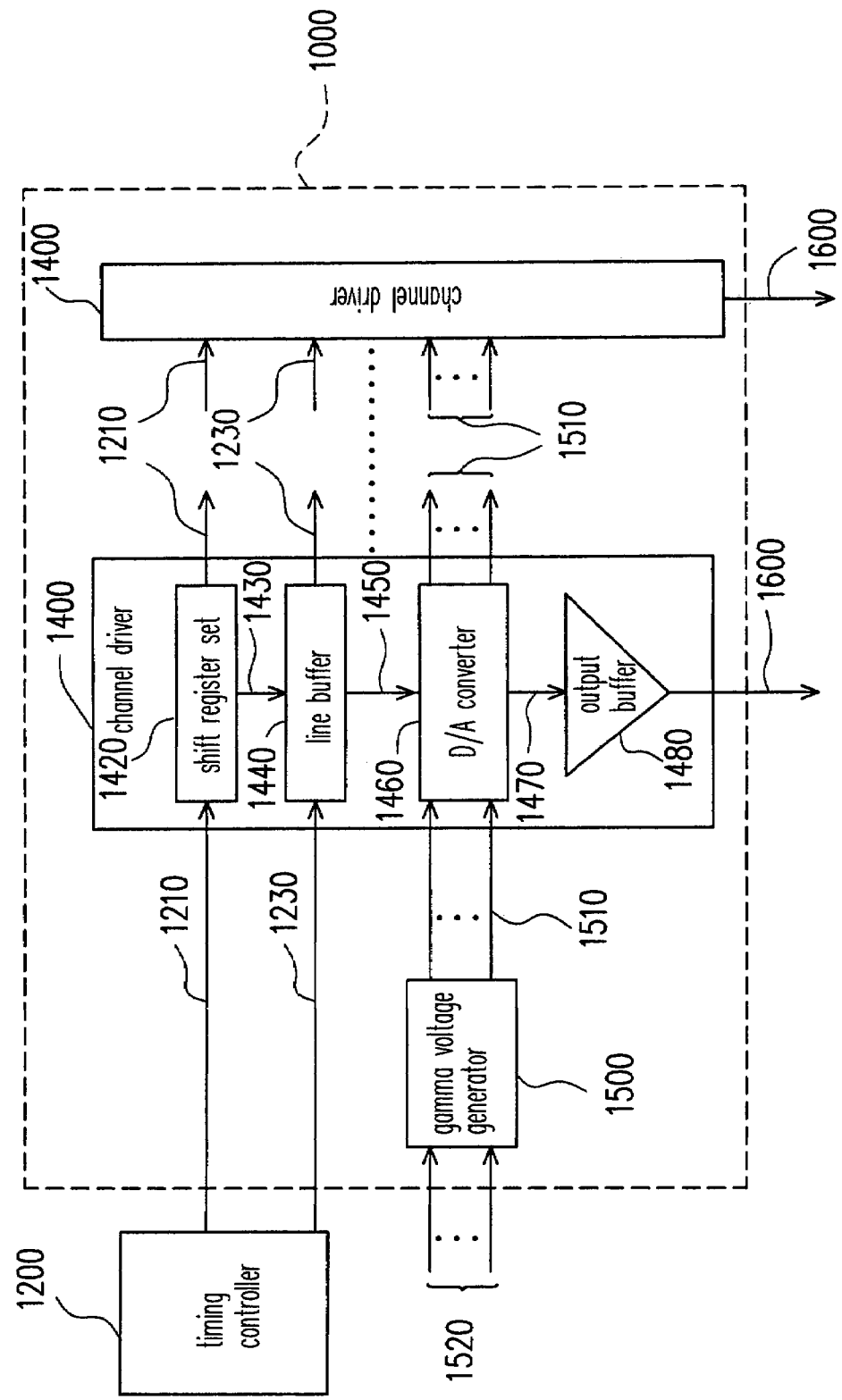
FIG. 1B is a detailed block diagram of the data driving circuit to illustrating in FIG. 1A.

For further describing data driving circuit 1000, FIG. 1B shows a more detailed block diagram of the data driving circuit 1000.

Only one set of channel driver 1400 in one data driving circuit 1000 is shown in FIG. 1B. The gamma voltage generator 1500 usually receives a plurality of gamma correction voltage 1520 and produces gamma voltages 1510 accordingly. The shift register set 1420 receives the initial pulse signal and the first and second clock signal to store these signals according to the timing signal from the timing controller 1200. The shift register set 1420 may include a number of shift registers (see, e.g., FIG. 5A). These stored signals are outputted to form a parallel display data 1430. The line buffer 1440 latches the display data 1430 according to the horizontal synchronization signal 1230 for producing display data 1450. The D/A converter 1460 receives display data 1450 and gamma voltages 1510, selects one of the gamma voltages 1510 according to the display data 1450 and outputs a driving signal 1470.

For improving driving capability of the driving signals, an output buffer 1480 is added at the output terminal of each lines driver. The output buffer 1480 receives driving signal 1470 and outputs a driving signal 1600 to data line 1410.

Figure 1C:
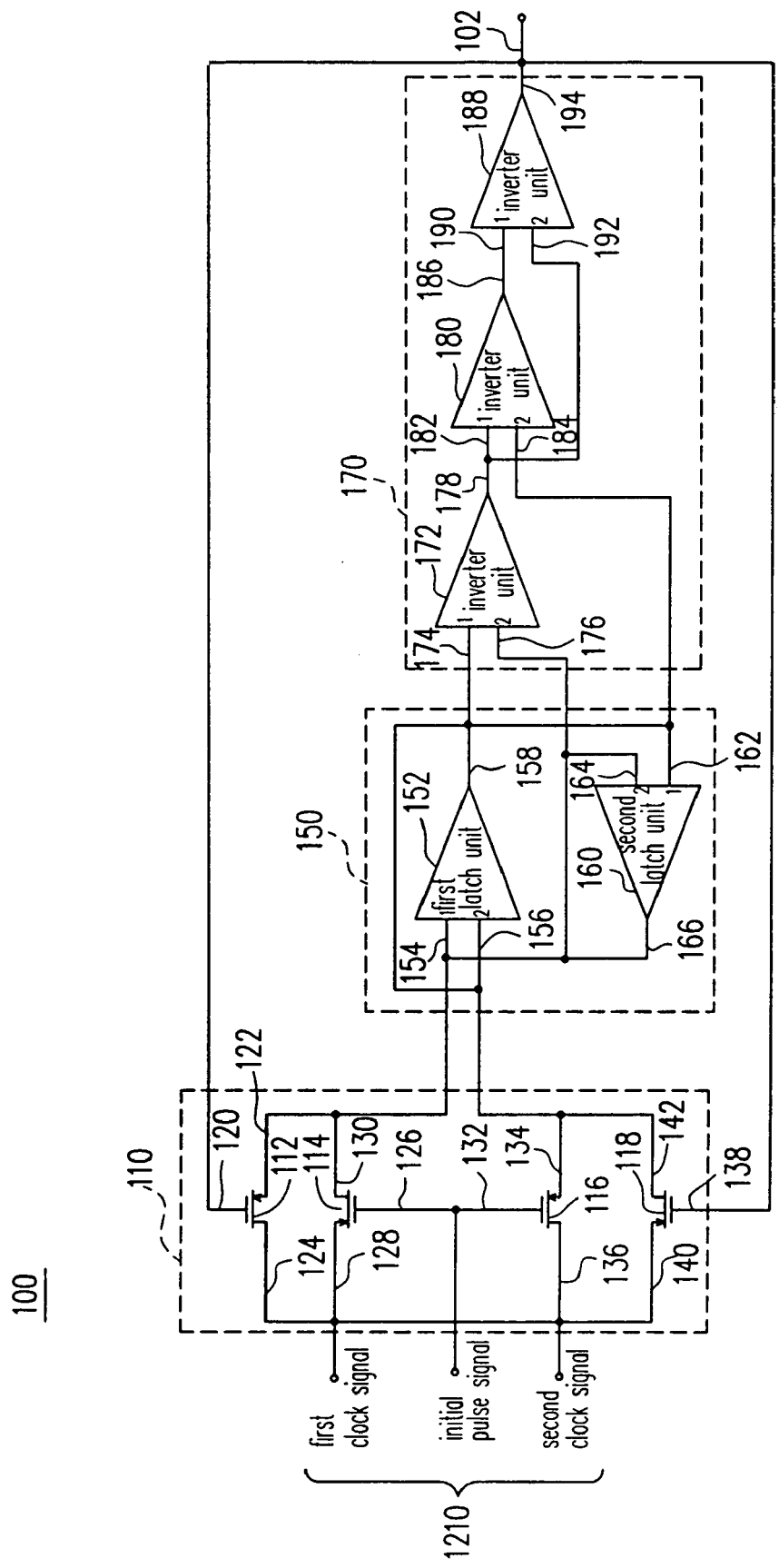
FIG. 1C is a circuit diagram of a shift register in accordance with an embodiment of the present invention.

FIG. 1C is a circuit diagram of a shift register in accordance with an embodiment of the present invention. In FIG. 1C, a single stage shift register 100 in the shift register set 1420 includes a switch circuit 110, a latch circuit 150, and an inverter circuit 170.

In this embodiment, the switch circuit 110 includes a plurality of P-type transistors and has a first output terminal 130 and a second output terminal 142. The switch circuit 110, based on an initial pulse signal and an output signal from the inverter circuit 170, determines whether to output a first clock signal and a second clock signal to the first output terminal 130 of the switch circuit 110 and the second output terminal 142 of the switch circuit 110 respectively.

The switch circuit 110 includes a first P-type transistor 112, a second P-type transistor 114, a third P-type transistor 116, and a fourth P-type transistor 118. The source 124 of the first P-type transistor 112 receives the first clock signal; the gate 120 of the first P-type transistor 112 is coupled to the output terminal 194 of the inverter circuit 188 and receives the output signal and determines whether to turn on the first P-type transistor 112 based on the output signal. The source 130 of the second P-type transistor 114 is coupled to the drain 122 of the first P-type transistor 112; the gate 126 of the second P-type transistor 114 receives the initial pulse signal and determines whether to turn on the second P-type transistor 114 based on the initial pulse signal. The source 136 of the third P-type transistor 116 receives the second clock signal; the gate 132 of the third P-type transistor 116 receives the initial pulse signal and determines whether to turn on the third P-type transistor 116 based on the initial pulse signal. The drain 140 of the fourth P-type transistor 118 receives the second clock signal; the source 142 of the fourth P-type transistor 118 is coupled to the drain 134 of the third P-type transistor 116; the gate 138 of the fourth P-type transistor 118 is coupled to the output terminal 188 of inverter circuit 194 and receives the output signal and determines whether to turn on the fourth P-type transistor 118 based on the output signal.

In this embodiment, the source 130 of the second P-type transistor 114 is the first output terminal of the switch circuit 110, and the source 142 of the fourth P-type transistor 118 is the second output terminal of the switch circuit 110.

In this embodiment, the latch circuit 150 includes a first latch unit 152 and a second latch unit 160. The first latch unit 152 has a positive input terminal 154, a negative input terminal 156, and an output terminal 158. The positive input terminal 154 of the first latch unit 152 is coupled to the first output terminal 130 of the switch circuit 110; the negative input terminal 156 of the first latch unit 152 is coupled to the second output terminal 142 of the switch circuit 110; the output terminal 158 of the first latch unit 152 is coupled to the negative input terminal 156 of the first latch unit 152. The second latch unit 160 has a positive input terminal 162, a negative input terminal 164, and an output terminal 166. The positive input terminal 162 of the second latch unit 160 is coupled to the output terminal 158 of the first latch unit 152; the negative input terminal 164 of the second latch unit 160 is coupled to the output terminal 166 of the second latch unit 160; the output terminal 166 of the second latch unit 160 is coupled to the positive input terminal 154 of the first latch unit 152. The first output terminal of the latch circuit 150 is the output terminal 158 of the first latch unit 152, and the second output terminal of the latch circuit 150 is the output terminal 166 of the second latch unit 160.

In an embodiment, the latch circuit 150 latches the first clock signal when the first clock signal is at a logic low level and latches the second clock signal when the first clock signal is at a logic high level.

In this embodiment, the inverter circuit 170 includes an odd number of inverter units 172, 180, and 188. The first input terminal 174 is coupled to the output terminal 158 of the first latch unit 152 and the positive input terminal 162 of the second latch unit 160. The inverter circuit 170 outputs an output signal from the output terminal 194 of the last stage inverter unit 188. For simplicity purpose, this embodiment only uses three inverter units as an example. However, this example cannot be used to limit the scope of the present invention.

Figure 2:
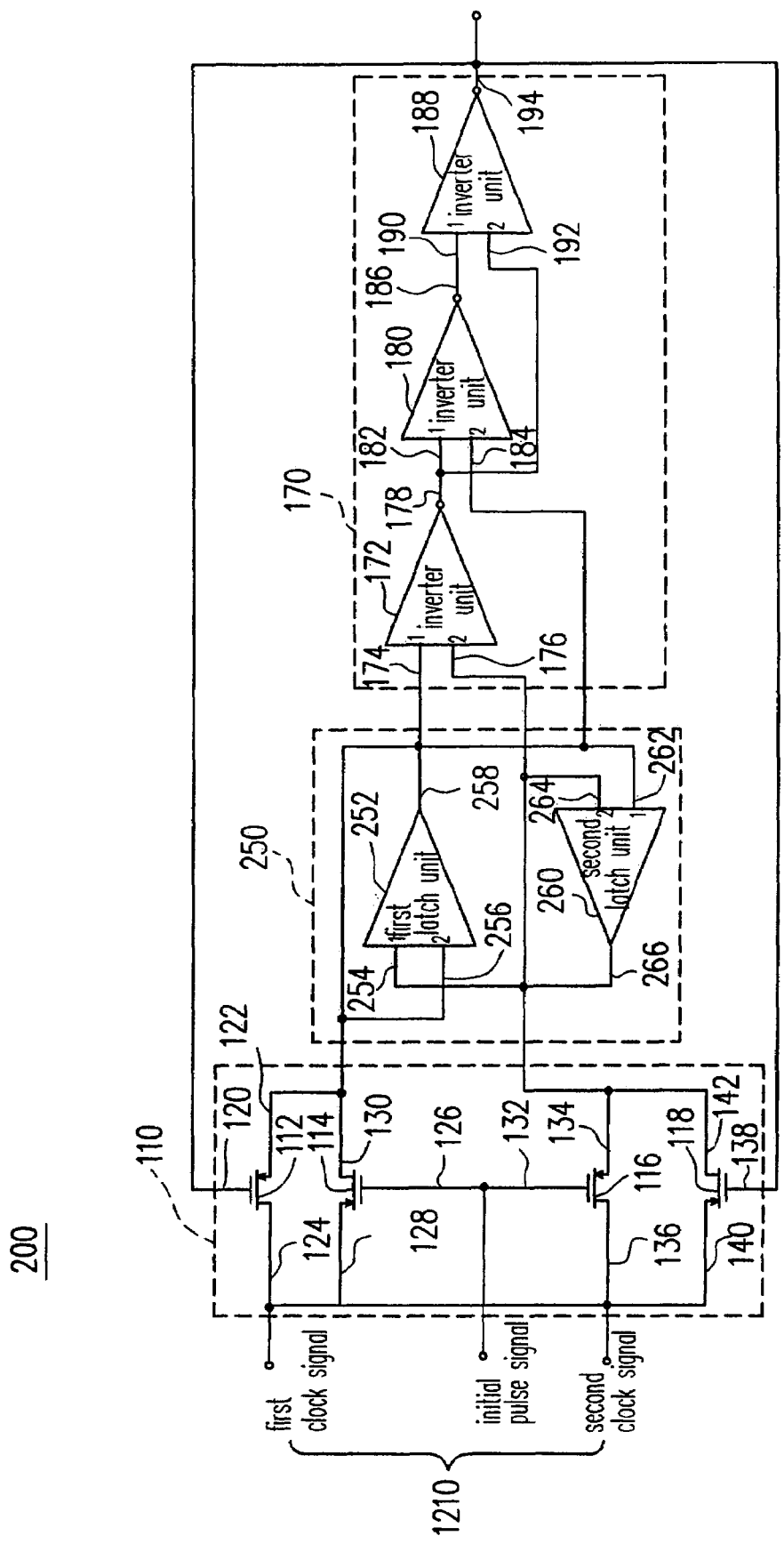
FIG. 2 is a circuit diagram of another shift register in accordance with an embodiment of the present invention.

FIG. 2 is a circuit diagram of another shift register in accordance with another embodiment of the present invention. The difference between FIG. 1C and FIG. 2 is that the latch circuit 250 is different from the latch circuit 150.

In this embodiment, the latch circuit 250 includes a first latch unit 252 and a second latch unit 260. The first latch unit 252 has a positive input terminal 254, a negative input terminal 256, and an output terminal 258. A positive input terminal 254 of the first latch unit 252 is coupled to the second output terminal 142 of the switch circuit 110; a negative input terminal 256 of the first latch unit 252 is coupled to the first output terminal 130 of the switch circuit 110; an output terminal 258 of the first latch unit 252 is coupled to the negative input terminal 256 of the first latch unit 252. The second latch unit 260 has a positive input terminal 262, a negative input terminal 264, and an output terminal 266. A positive input terminal 262 of the second latch unit 260 is coupled to the output terminal 258 of the first latch unit 252; a negative input terminal 264 of the second latch unit 260 is coupled to the output terminal 266 of the second latch unit 260; an output terminal 266 of the second latch unit 260 is coupled to the positive input terminal 254 of the first latch unit 252. One skilled in the art can understand that the first latch unit 252 and the second latch unit 260 can be, but is not limited to, inverters.

In this embodiment, the latch circuit 250 latches the second clock signal when the second clock signal is at a logic low level and latches the first clock signal when the second clock signal is at a logic high level.

Figures 3, 4:
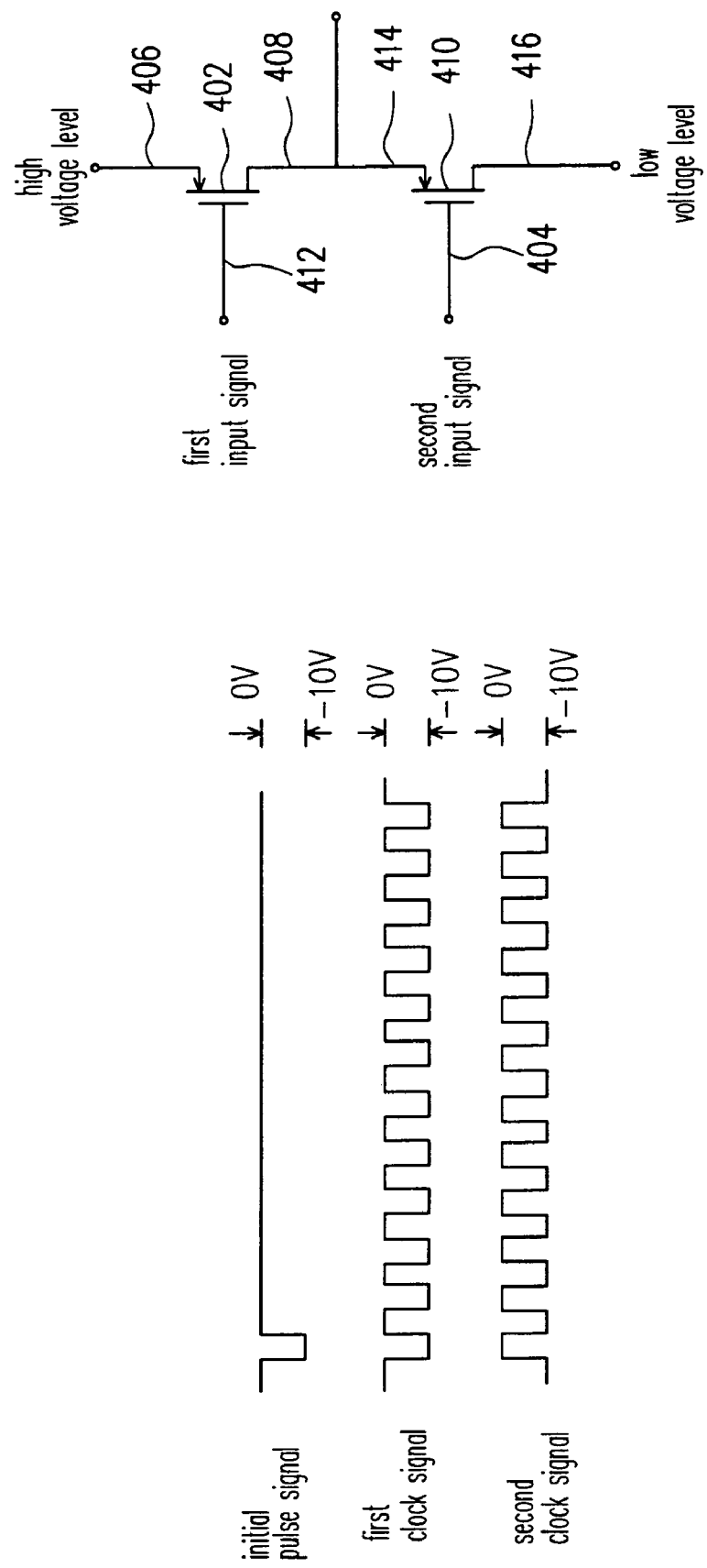
FIG. 3 shows the input signal waveform of a shift register in accordance with an embodiment of the present invention.
FIG. 4 is the circuit diagram of an inverter unit in accordance with an embodiment of the present invention.

FIG. 3 shows the input signal waveform of a shift register in accordance with an embodiment of the present invention. Referring to FIGS. 1C and 3, as shown in FIG. 3, when the first clock signal and the initial pulse signal are logic low, the second clock signal is logic high. At the time the second P-type transistor and the third P-type transistor are ON, the latch circuit 150 can latch the first clock signal. When the first clock signal and the initial pulse signal are logic high, the second clock signal is logic low. At the time the first P-type transistor and the fourth P-type transistor are ON, the latch circuit 150 can latch the second clock signal.

Referring to FIGS. 2 and 3, in this embodiment, when the first clock signal and the initial pulse signal are logic high, the second clock signal is logic low, and therefore the latch circuit 250 can latch the second clock signal. When the first clock signal and the initial pulse signal are logic low, the second clock signal is logic high, and therefore the latch circuit 250 can latch the first clock signal.

In this embodiment, the shift register 100 operates only when the input signal is logic high or logic low and will not be affected by the signal rising time and the falling time.

FIG. 4 is the circuit diagram of each of the inverter units 172, 180, 188 in accordance with an embodiment of the present invention. Each of the inverter units 172, 180, and 188 includes a P-type transistor 402 and a P-type transistor 410. The drain 406 of the P-type transistor 402 is coupled to a high voltage level; the gate 412 of the P-type transistor 402 receives a first input signal. The drain 414 of the P-type transistor 410 is coupled to the source 408 of the P-type transistor 402; the source 416 of the P-type transistor 410 is coupled to a low voltage level; the gate 404 of the P-type transistor 410 receives a second input signal. When the first input signal is logic low and the second input signal is logic high, the output signal is logic high; when the first input signal is logic high and the second input signal is logic high, the output signal is logic low; when the first input signal is logic high and the second input signal is logic low, the output signal is logic low.

Figure 5A:
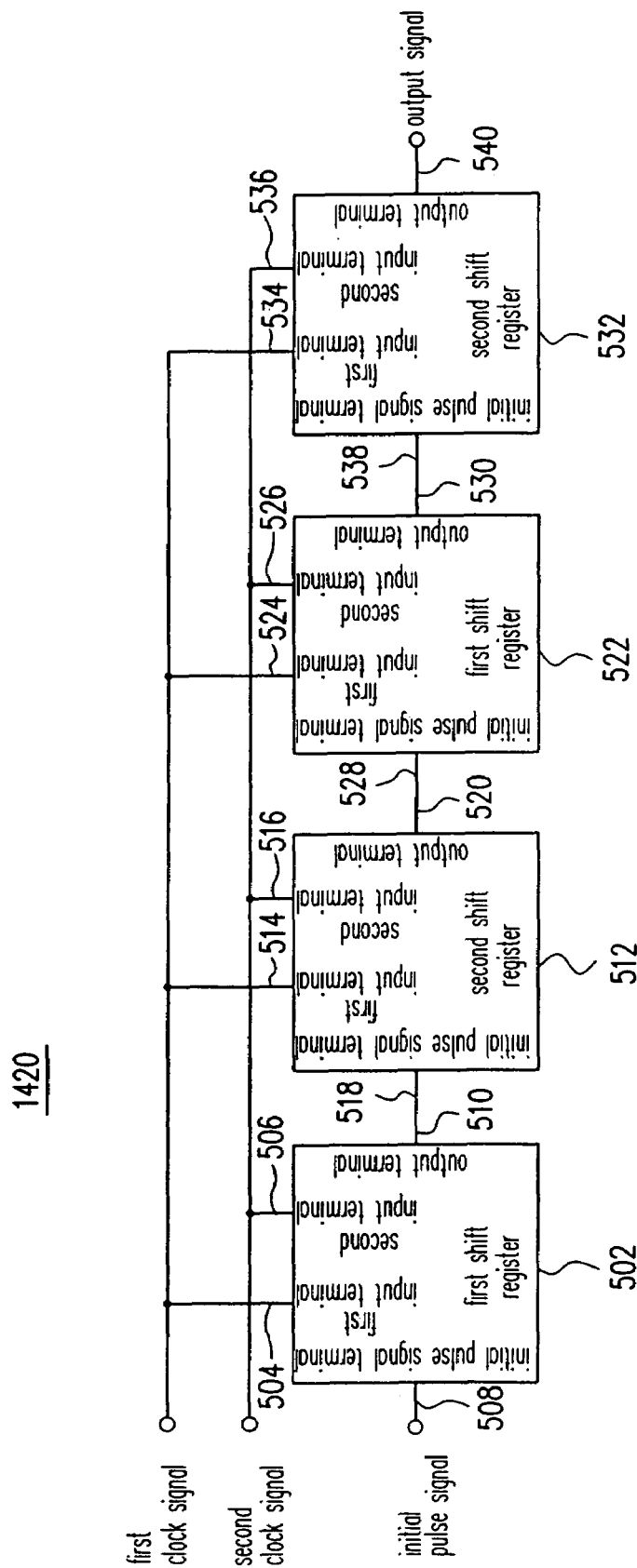
FIG. 5A is a circuit diagram of a shift register set in accordance with an embodiment of the present invention.

FIG. 5A is a circuit diagram of a shift register set 1420 in accordance with an embodiment of the present invention. For simplicity purpose, this embodiment only uses four shift registers as an example. This example cannot be used to limit the scope of the present invention. The shift register set 1420 includes first shift registers 502 and 522, and second shift registers 512 and 532. Each shift register includes a first input terminal 504/514/524/534, a second input terminal 506/516/526/536, an initial pulse signal terminal 508/518/528/538, and an output terminal 510/520/530/540. The first input terminals 504, 514, 524 and 534 receive the first clock signal. The second input terminals 506, 516, 526, and 536 receive the second clock signal. The output terminals 510 and 530 of the first shift registers 502 and 522 are respectively coupled to the initial pulse signal terminals 518 and 538 of the second shift registers 512 and 532. The output terminal 520 of the second shift register 512 is coupled to the initial pulse signal terminal 528 of the first shift register 522. The initial pulse signal terminal 508 of the first shift register 502 receives an initial pulse signal. In light of the above connection relationship, the output of the previous stage shift register will control the turn-on time of the next stage shift register.

In this embodiment of the present invention, when the first shift registers 502 and 522 are the circuit shown in FIG. 1C, the second shift registers 512 and 532 can be, but is not limited to, the circuit shown in FIG. 2. On the contrary, when the first shift registers 502 and 522 are the circuit shown in FIG. 2, the second shift registers 512 and 532 can be, but is not limited to, the circuit shown in FIG. 1C.

Figure 5B:
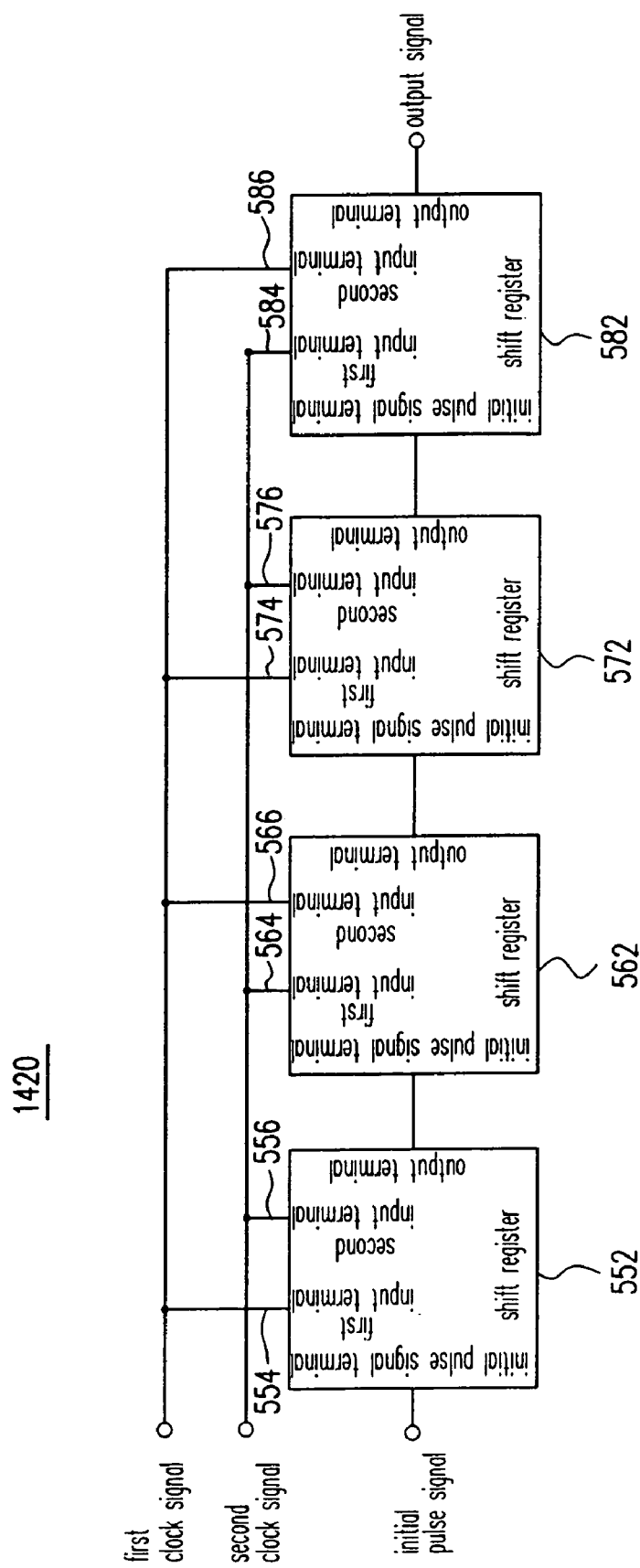
FIG. 5B is a circuit diagram of another shift register set in accordance with an embodiment of the present invention.

FIG. 5B is a circuit diagram of another shift register set in accordance with an embodiment of the present invention. The difference between FIG. 5A and FIG. 5B is that a first input terminal 564 of a second stage shift register 562 and a first input terminal 584 of a fourth stage shift register 582 receive a second clock signal, a second input terminal 566 of the second stage shift register 562 and a second input terminal 586 of the fourth stage shift register 582 receive a first clock signal. In FIG. 5B, a first input terminal 554 of a first stage shift register 554 and a first input terminal 574 of a third stage shift register 572 receive the first clock signal; a second input terminal 556 of the first stage shift register 554 and a second input terminal 576 of the third stage shift register 572 receive the second clock signal. In FIG. 5B, the shift registers 552, 562, 572, and 582 can be the shift registers in FIG. 1 or FIG. 2.

Figure 6:
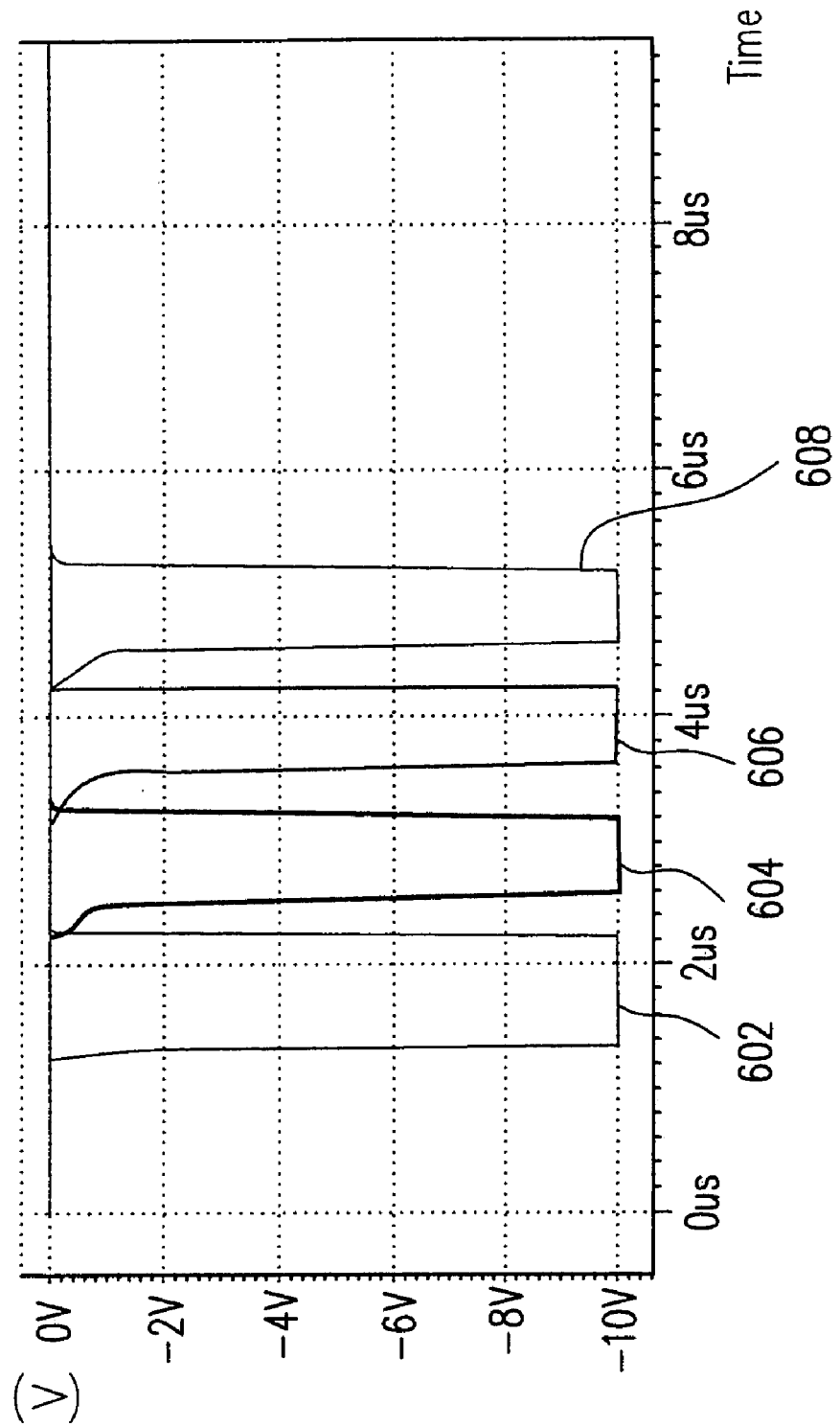
FIG. 6 shows the voltage-time curve for each stage shift register set in accordance with an embodiment of the present invention.
Figure 7:
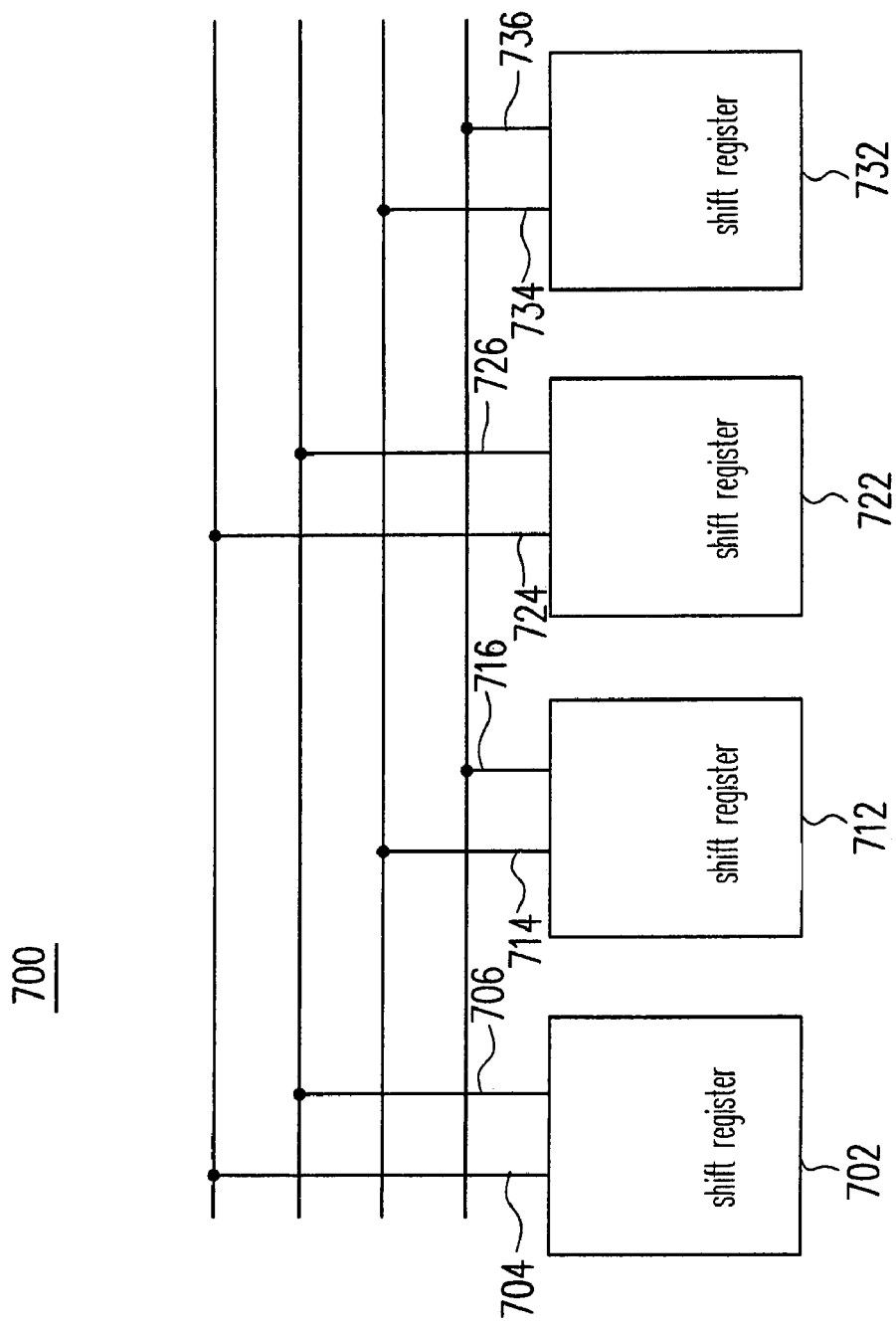
FIG. 7 is the block diagram of the conventional shift register set.
Figure 8:
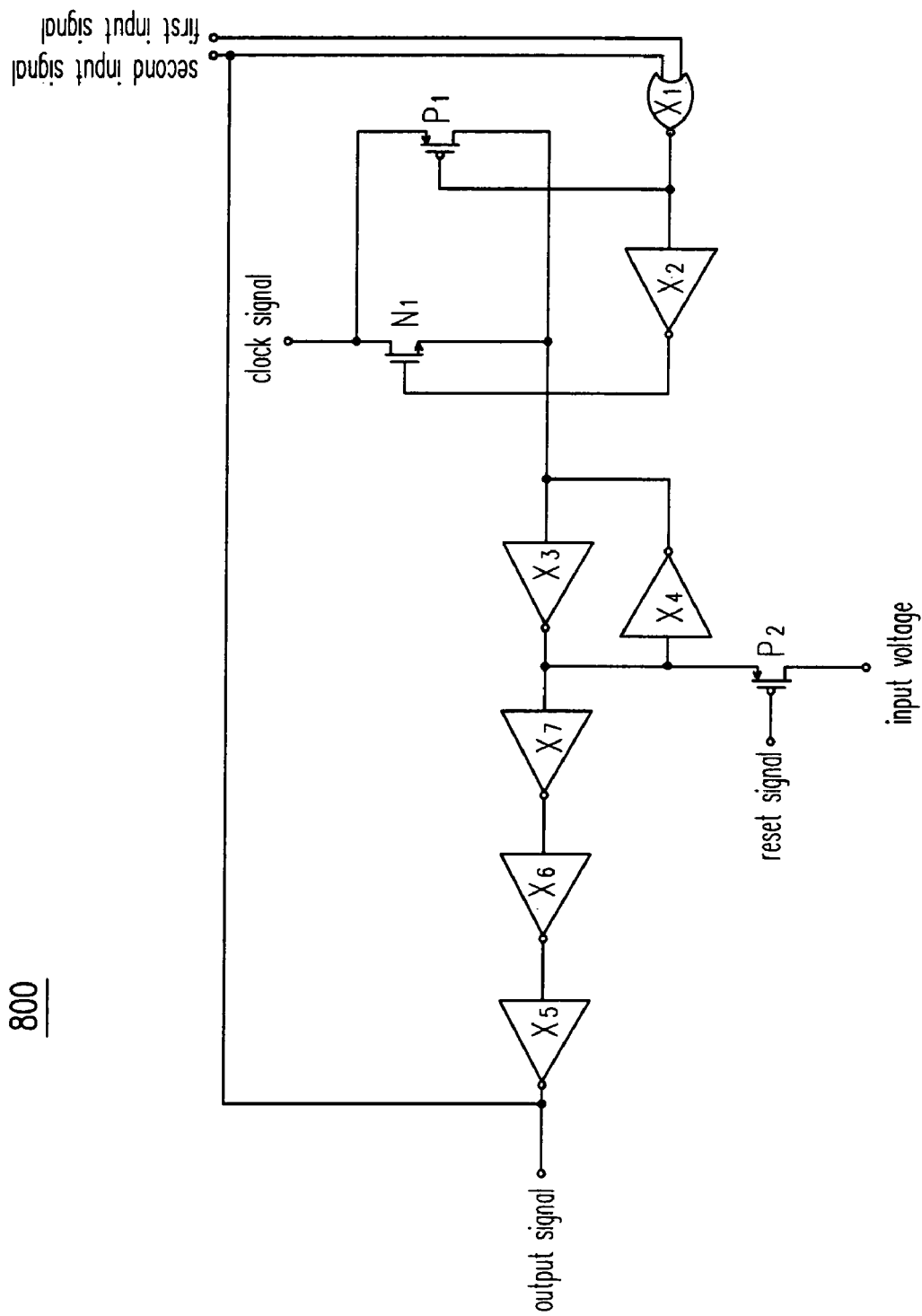
FIG. 8 is the circuit diagram of the conventional shift register.

FIG. 6 shows the voltage-time curve for each shift register set in accordance with an embodiment of the present invention. For example, referring to FIGS. 5A and 6, in this embodiment, the curve 602 represents the output signal from the output terminal 510 of the first stage shift register 502; the curve 604 represents the output signal from the output terminal 520 of the second stage shift register 512; the curve 606 represents the output signal from the output terminal 530 of the third stage shift register 522; the curve 608 represents the output signal from the output terminal 540 of the fourth stage shift register 532. Referring to FIG. 6, by serially connecting the shift registers in FIG. 1C and FIG. 2, after inputting the first clock signal, the second clock signal, and the initial pulse signal, the output curve (waveform) from the output terminal can be controlled. The output of a previous stage shift register can be used to control the turn-on time of the next stage shift register.

In light of the above, the shift register of the present invention changes the driving signal from the dynamic signal to the static signal so that the circuit can operate only when the signal is "0" or "1" without being affected by the signal rising time and the falling time. Hence, the circuit can operate in a more stable status and the shift register for the liquid crystal display requires two clock signals only.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A shift register, comprising:
    a switch circuit having a first output terminal and a second output terminal, and input terminals for receiving an initial pulse signal and an output signal of the shift register, wherein when one of an initial pulse signal and an output signal of the shift register is at a logic low level, said switch circuit outputs a first clock signal and a second clock signal via said first output terminal of said switch circuit and said second output terminal of said switch circuit respectively;
    a latch circuit, having a first input terminal, a second input terminal, a first output terminal and a second output terminal, said first input terminal of said latch circuit being coupled to said first output terminal of said switch circuit, said second output terminal of said latch circuit being coupled to said second output terminal of said switch circuit, for latching one of said first clock signal and said second clock signal; and
    an inverter circuit, having a first input terminal, a second input terminal, and an output terminal, said first input terminal of said inverter circuit being coupled to said first output terminal of said latch circuit, said second input terminal of said inverter circuit being coupled to said second output terminal of said latch circuit, for outputting an output signal from said output terminal of said inverter circuit, said output signal having opposite phase to a signal from the first output terminal of the latch circuit which is inputted to said first input terminal of said inverter circuit;
    wherein said first clock signal and said initial pulse signal have the same phase, and said first clock signal and said second clock signal have the opposite phases.

2. The shift register of claim 1, wherein said latch circuit includes:
    a first latch unit, having a positive input terminal, a negative input terminal, and an output terminal, said positive input terminal of said first latch unit being coupled to said first output terminal of said switch circuit, said negative input terminal of said first latch unit being coupled to said second output terminal of said switch circuit, said output terminal of said first latch unit being coupled to said negative input terminal of said first latch unit; and
    a second latch unit, having a positive input terminal, a negative input terminal, and an output terminal, said positive input terminal of said second latch unit being coupled to said output terminal of said first latch unit, said negative input terminal of said second latch unit being coupled to said output terminal of said second latch unit, said output terminal of said second latch unit being coupled to said positive input terminal of said first latch unit;
    wherein said first output terminal of said latch circuit is said output terminal of said first latch unit, and said second output terminal of said latch circuit is said output terminal of said second latch unit.

3. The shift register of claim 2, wherein said latch circuit latches said first clock signal when said first clock signal is at a logic low level and said latch circuit latches said second clock signal when said first clock signal is at a logic high level.

4. The shift register of claim 1, wherein said latch circuit includes:
    a first latch unit, having a positive input terminal, a negative input terminal, and an output terminal, said positive input terminal of said first latch unit being coupled to said second output terminal of said switch circuit, said negative input terminal of said first latch unit being coupled to said first output terminal of said switch circuit, said output terminal of said first latch unit being coupled to said negative input terminal of said first latch unit; and
    a second latch unit, having a positive input terminal, a negative input terminal and an output terminal, said positive input terminal of said second latch unit being coupled to said output terminal of said first latch unit, said negative input terminal of said second latch unit being coupled to said output terminal of said second latch unit, said output terminal of said second latch unit being coupled to said positive input terminal of said first latch unit;
    wherein said first output terminal of said latch circuit is said output terminal of said first latch unit, and said second output terminal of said latch circuit is said output terminal of said second latch unit.

5. The shift register of claim 4, wherein said latch circuit latches said second clock signal when said second clock signal is at a logic low level and said latch circuit latches said first clock signal when said second clock signal is at a logic high level.

6. The shift register of claim 1, wherein said switch circuit includes:
    a first transistor, a source of said first transistor being coupled to a signal source of said first clock signal, a gate of said first transistor being coupled to said output terminal of said inverter circuit, for receiving said output signal and determining whether to turn on said first transistor based on said output signal;
    a second transistor, a source of said second transistor being coupled to a drain of said first transistor, a gate of said second transistor being coupled to a signal source of said initial pulse signal, for receiving said initial pulse signal and determining whether to turn on said second transistor based on said initial pulse signal;

a third transistor, a source of said third transistor being coupled to said signal source of said second clock signal, a gate of said third transistor being coupled to said signal source of said initial pulse signal, for receiving said initial pulse signal and determining whether to turn on said third transistor based on said initial pulse signal; and a fourth transistor, a drain of said fourth transistor being coupled to said signal source of said second clock signal, a source of said fourth transistor being coupled to a drain of said third transistor, a gate of said fourth transistor being coupled to said output terminal of said inverter circuit, for receiving said output signal and determining whether to turn on said fourth transistor based on said output signal;

wherein said source of said second transistor is said first output terminal of said switch circuit, and said drain of said third transistor is said second output terminal of said switch circuit.

7. The shift register of claim 1, wherein said inverter circuit includes an odd number of inverter units, and each said inverter unit includes:

a first P-type transistor, a drain of said first P-type transistor being coupled to a high voltage level, a gate of said first P-type transistor receiving a first input signal, for determining whether to turn on said first P-type transistor based on said first input signal; and a second P-type transistor, a drain of said second P-type transistor being coupled to a source of said first P-type transistor, a source of said second P-type transistor being coupled to a low voltage level, a gate of said second P-type transistor receiving a second input signal, for determining whether to turn on said second P-type transistor based on said second input signal;

wherein each said inverter unit determines whether to output one of a logic high level and a logic low Level based on whether said first P-type transistor and second P-type transistor are turned on.

8. A shift register set, said shift register set receiving a first clock signal, a second clock signal, and an initial pulse signal, said shift register set comprising:

at least an odd stage shift register, having a first input terminal, a second input terminal, an initial pulse signal terminal, and an output terminal, said first input terminal of said odd stage shift register receiving said first clock signal, said second input terminal of said odd stage shift register receiving said second clock signal, said initial pulse signal terminal of said odd stage shift register receiving one of said initial pulse signal and an output signal of a previous stage shift register, said output terminal of said odd stage shift register outputting an output signal; and at least an even stage shift register, having a first input terminal, a second input terminal, an initial pulse signal terminal, and an output terminal, said first input terminal of said even stage shift register receiving said second clock signal, said second input terminal of said even stage shift register receiving said first clock signal, said initial pulse signal terminal of said even stage shift register being coupled to said output terminal of said odd stage shift register previous to said even stage shift register;

wherein said first clock signal and said initial pulse signal have the same phase, said first clock signal and said second clock signal have the opposite phases, and each of said odd stage shift register and said even stage shift register comprises the shift register as recited in claim 1.

9. A shift register set, comprising:

at least a first shift register and a second shift register operatively coupled in series, each shift register having a first input terminal and a second input terminal, an output terminal, and an initial pulse signal terminal; and a first clock signal and a second clock signal, each coupled to one of the first input terminal and the second input terminal for each of the first and second shift registers, wherein each of the first and second shift registers comprises the shift register as recited in claim 1.

10. An electronic device, comprising:

a timing controller generating a first clock signal, a second clock signal and an initial pulse signal; and a shift register set, comprising:

at least a first shift register and a second shift register operatively coupled in series, each shift register having a first input terminal and a second input terminal, an output terminal, and an initial pulse signal terminal, wherein the first clock signal and the second clock signal, each coupled to one of the first input terminal and the second input terminal for each of the first and second shift registers, wherein each of the first and second shift registers comprises the shift register as recited in claim 1.

11. A shift register set, said shift register set receiving a first clock signal, a second clock signal, and an initial pulse signal, said shift register set comprising:

at least an odd stage shift register, having a first input terminal, a second input terminal, an initial pulse signal terminal, and an output terminal, said first input terminal of said odd stage shift register receiving said first clock signal, said second input terminal of said odd stage shift register receiving said second clock signal, said initial pulse signal terminal of said odd stage shift register receiving one of said initial pulse signal and an output signal of a previous stage shift register, said output terminal of said odd stage shift register outputting an output signal; and at least an even stage shift register, having a first input terminal, a second input terminal, an initial pulse signal terminal, and an output terminal, said first input terminal of said even stage shift register receiving said second clock signal, said second input terminal of said even stage shift register receiving said first clock signal, said initial pulse signal terminal of said even stage shift register being coupled to said output terminal of said odd stage shift register previous to said even stage shift register;

wherein said first clock signal and said initial pulse signal have the same phase, said first clock signal and said second clock signal have the opposite phases, and each of said odd stage shift register and said even stage shift register comprises:

a switch circuit, including a plurality of transistors, said switch circuit having a first output terminal and a second output terminal, wherein when one of an initial pulse signal and an output signal of said switch circuit is at logic low level, said switch circuit outputs a first clock signal and a second clock signal via said first output terminal of said switch circuit and said second output terminal of said switch circuit respectively;

a latch circuit, having a first input terminal, a second input terminal, a first output terminal and a second output terminal, said first input terminal of said latch circuit being coupled to said first output terminal of said switch circuit, said second input terminal of said latch circuit being coupled to said second output terminal of said switch circuit, for latching one of said first clock signal and said second clock signal; and an inverter circuit, having a first input terminal, a second input terminal, and an output terminal, said first input terminal of said inverter circuit being coupled to said first output terminal of said latch circuit, said second input terminal of said inverter circuit being coupled to said second output terminal of said latch circuit, for outputting said output signal from said output terminal of said inverter circuit, said output signal having opposite phase to a signal inputted to said first input terminal of said inverter circuit.

12. The shift register set of claim 11, wherein when there is a plurality of odd stage shift registers and even stage shift registers, said plurality of odd stage shift registers and said plurality of even stage shift registers are alternately arranged.

13. The shift register set of claim 11, wherein said switch circuit includes:

a first transistor, a source of said first transistor being coupled to a signal source of said first clock signal, a gate of said first transistor being coupled to said output terminal of said inverter circuit, for receiving said output signal and determining whether to turn on said first transistor based on said output signal;

a second transistor, a source of said second transistor being coupled to a drain of said first transistor, a gate of said second transistor being coupled to a signal source of said initial pulse signal, for receiving said initial pulse signal and determining whether to turn on said second transistor based on said initial pulse signal;

a third transistor, a source of said third transistor being coupled to said signal source of said second clock signal, a gate of said third transistor being coupled to said signal source of said initial pulse signal, for receiving said initial pulse signal and determining whether to turn on said third transistor based on said initial pulse signal; and a fourth transistor, a drain of said fourth transistor being coupled to said signal source of said second clock signal, a source of said fourth transistor being coupled to a drain of said third transistor, a gate of said fourth transistor being coupled to said output terminal of said inverter circuit, for receiving said output signal and determining whether to turn on said fourth transistor based on said output signal;

wherein said source of said second transistor is said first output terminal of said switch circuit, and said drain of said third transistor is said second output terminal of said switch circuit.

14. A shift register set, comprising:

at least a first shift register and a second shift register operatively coupled in series, each shift register having a first input terminal and a second input terminal, an output terminal, and an initial pulse signal terminal; and a first clock signal and a second clock signal, each coupled to one of the first input terminal and the second input terminal for each of the first and second shift registers, wherein each of the first and second shift register comprises:

a switch circuit, including a plurality of transistors, said switch circuit having a first output terminal and a second output terminal, wherein when one of an initial pulse signal and an output signal of said switch circuit is at logic low level, said switch circuit outputs a first clock signal and a second clock signal via said first output terminal of said switch circuit and said second output terminal of said switch circuit respectively;

a latch circuit, having a first input terminal, a second input terminal, a first output terminal and a second output terminal, said first input terminal of said latch circuit being coupled to said first output terminal of said switch circuit, said second input terminal of said latch circuit being coupled to said second output terminal of said switch circuit, for latching one of said first clock signal and said second clock signal; and an inverter circuit, having a first input terminal, a second input terminal, and an output terminal, said first input terminal of said inverter circuit being coupled to said first output terminal of said latch circuit, said second input terminal of said inverter circuit being coupled to said second output terminal of said latch circuit, for outputting said output signal from said output terminal of said inverter circuit, said output signal having opposite phase to a signal inputted to said first input terminal of said inverter circuit.

15. The shift register set as in claim 14, wherein the first clock signal is coupled to the first input terminal of the first shift register and the second input terminal of the second shift register, and the second clock signal is coupled to the second input terminal of the first shift register and the first input terminal of the second shift register.

16. The shift register set as in claim 14, wherein the first clock signal is coupled to the first input terminal of the first shift register and the first input terminal of the second shift register, and the second clock signal is coupled to the second input terminal of the first shift register and the second input terminal of the second shift register.

17. The shift register set as in claim 14, wherein the output terminal of the first shift register is coupled to the initial pulse signal terminal of the second shift register.

18. An electronic device, comprising:

a timing controller generating a first clock signal, a second clock signal and an initial pulse signal; and a shift register set, comprising:

at least a first shift register and a second shift register operatively coupled in series, each shift register having a first input terminal and a second input terminal, an output terminal, and an initial pulse signal terminal, wherein the first clock signal and the second clock signal, each coupled to one of the first input terminal and the second input terminal for each of the first and second shift registers, wherein each of said first and second shift registers comprises:

a switch circuit, including a plurality of transistors, said switch circuit having a first output terminal and a second output terminal, wherein when one of an initial pulse signal and an output signal of said switch circuit is at logic low level, said switch circuit outputs a first clock signal and a second clock signal via said first output terminal of said switch circuit and said second output terminal of said switch circuit respectively;

a latch circuit, having a first input terminal, a second input terminal, a first output terminal and a second output terminal, said first input terminal of said latch circuit being coupled to said first output terminal of said switch circuit, said second input terminal of said latch circuit being coupled to said second output terminal of said switch circuit, for latching one of said first clock signal and said second clock signal; and an inverter circuit, having a first input terminal, a second input terminal, and an output terminal, said first input terminal of said inverter circuit being coupled to said first output terminal of said latch circuit, said second input terminal of said inverter circuit being coupled to said second output terminal of said latch circuit, for outputting said output signal from said output terminal of said inverter circuit, said output signal having opposite phase to a signal inputted to said first input terminal of said inverter circuit.

19. The electronic, device as in claim 18, further comprising a display device, wherein the display device is control in part by the shift register set.

* * * * *